US008059484B2

(12) United States Patent
Yoko

(10) Patent No.: US 8,059,484 B2
(45) Date of Patent: Nov. 15, 2011

(54) SEMICONDUCTOR STORAGE DEVICE AND HIGH-SPEED ADDRESS-LATCHING METHOD

(75) Inventor: Hideyuki Yoko, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 508 days.

(21) Appl. No.: 12/285,165

(22) Filed: Sep. 30, 2008

(65) Prior Publication Data

US 2009/0097329 A1    Apr. 16, 2009

(30) Foreign Application Priority Data

Oct. 11, 2007    (JP) ................................ P2007-265418

(51) Int. Cl.
*G11C 8/00* (2006.01)

(52) U.S. Cl. .............. 365/233.1; 365/189.051

(58) Field of Classification Search ............... 365/233.1, 365/189.05; 327/291
See application file for complete search history.

(56) References Cited

U.S. PATENT DOCUMENTS

2008/0111596 A1*   5/2008   Lee .............................. 327/153
2008/0157845 A1*   7/2008   Yang ........................... 327/291

FOREIGN PATENT DOCUMENTS

JP    2003-076602    3/2003

* cited by examiner

*Primary Examiner* — Anh Phung
(74) *Attorney, Agent, or Firm* — McGinn IP Law Group, PLLC

(57) ABSTRACT

A semiconductor storage device includes: an input buffer that receives address data and command data; a first through-latch-type latch circuit that latches the command data in synchronism with a rising edge of a clock signal; and a second through-latch-type latch circuit that latches the address data in synchronism with a falling edge of the clock signal.

19 Claims, 10 Drawing Sheets

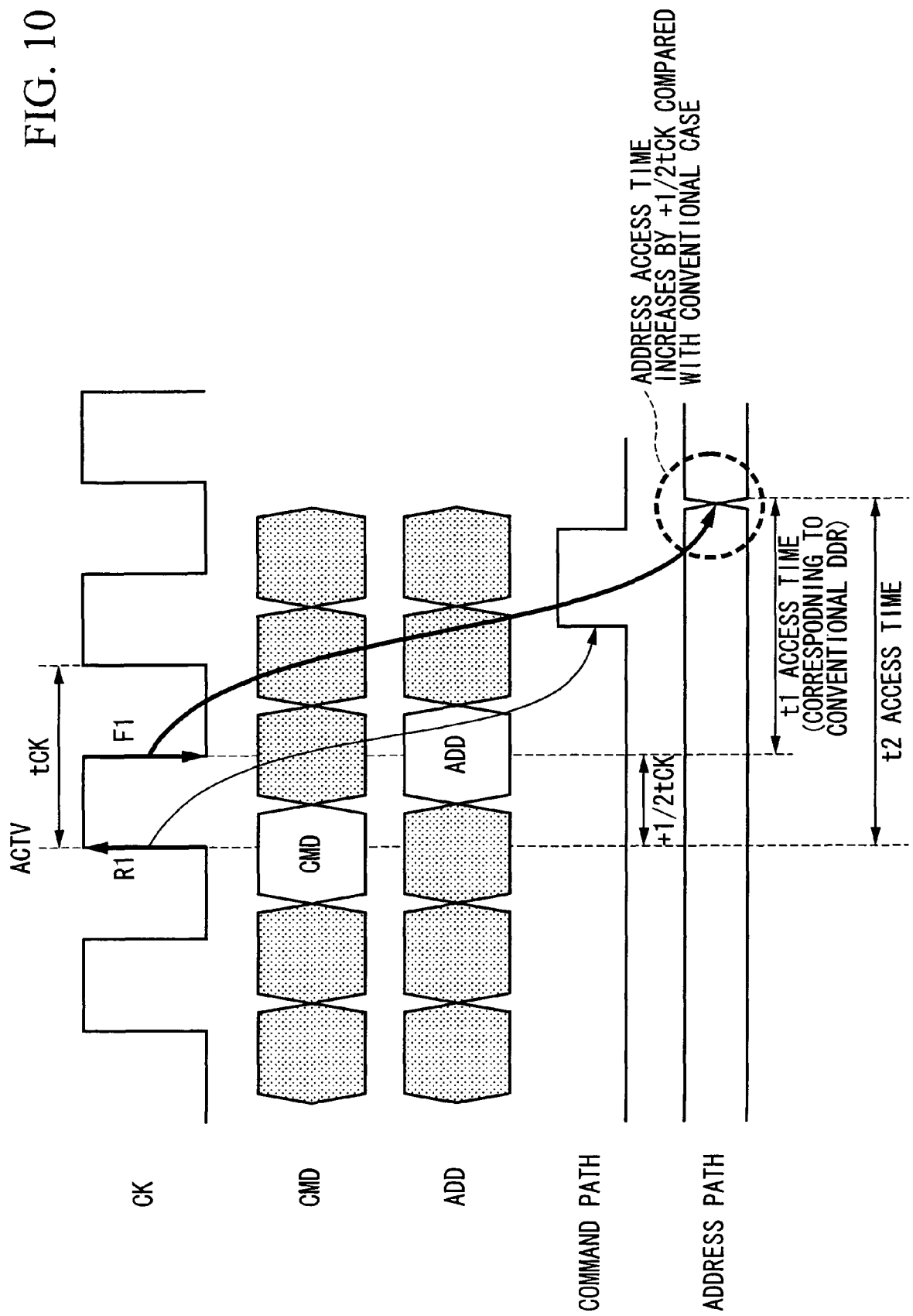

SEMICONDUCTOR STORAGE DEVICE AND HIGH-SPEED ADDRESS-LATCHING METHOD

BACKGROUND OF THE INVENTION

1. Field of the Invention

The present invention relates to a semiconductor storage device and a high-speed address-latching method that are compatible with a high-speed DDR (Double Data Rate) system, for example, LPDDR2 (Low Power DDR2).

Priority is claimed on Japanese Patent Application No. 2007-265418, filed Oct. 11, 2007, the content of which is incorporated herein by reference.

2. Description of the Related Art

Recently, semiconductor storage devices have required both low power consumption and high speed operation, and thereby required the high access efficiency of each signal. For example, DRAM compliant with LPDDR2 specifications has been required.

As a high-speed address-latching system in the DDR system, a function of sharing input pins for an address signal and a command signal that have been conventionally separated and a function of fetching a command and an address on rising and falling edges of a clock signal are under consideration.

In a conventional general DDR circuit as shown in FIG. 9A, command data and address data are fetched in synchronism with only a rising edge R1 of a clock signal CK (with a period of tCK) in the case of an ACTV (activation) command, for example.

As shown in FIG. 9B, an edge-trigger-type latch circuit 20 is used as the latch circuit for fetching command data and address data. As a result, an access time is determined by a trigger signal generated based on the rising edge R1 of the clock signal CK.

Since data are fetched both on rising and falling edges in the high-speed system, access penalty of a period ½ tCK occurs as shown in FIG. 10 if the edge-trigger-type latch circuit 20 shown in FIG. 9B is used. In other words, an address access time t1 is determined based on a falling edge F1, and an access time t2 from the rising edge R1 increases by ½ tCK compared with the access time t1.

For this reason, the problem of the access penalty of the period ½ tCK has been required to be solved in the DDR high-speed address-fetching system in which the input pins for the address signal and the command signal are shared and command data and address data are fetched both on rising and falling edges.

A memory control method and a memory control circuit are disclosed in Japanese Unexamined Patent Application, Fast Publication No. 2003-76602 as the conventional technique related to the present invention. However, an object of the memory control method and the memory control circuit of conventional techniques is to propose a memory control circuit that enables flexible and easy post-adjustment without much load on memory design and difficulty in dedicate timing adjustment, and not to solve the problem of the access penalty of the period ½ tCK in the DDR high-speed system.

SUMMARY

In one embodiment, a semiconductor storage device may include: an input buffer that receives address data and command data; a first through-latch-type latch circuit that latches the command data in synchronism with a rising edge of a clock signal; and a second through-latch-type latch circuit that latches the address data in synchronism with a falling edge of the clock signal.

Accordingly, an access time from the falling edge can be reduced by a setup time upon an address latch, and the access penalty of ½ tCK can be reduced.

In another embodiment, a semiconductor storage device may include: an input buffer that receives address data and command data; an edge-trigger-type latch circuit that latches the command data in synchronism with a rising edge of a clock signal; and a through-latch-type latch circuit that latches the address data in synchronism with a falling edge of the clock signal.

Accordingly, data can be stably latched by the edge-trigger-type latch circuit upon a command latch, an access time from the falling edge can be reduced by a setup time upon an address latch, and the access penalty of ½ tCK can be reduced.

In another embodiment, a semiconductor device may include: an input node supplied with an input signal; a first latch circuit having a first input end coupled to the input node to receive the input signal and a first output end, the first latch circuit operating in response to a first clock signal; and a second latch circuit having a second input end coupled to the input node to receive the input signal and a second output end, the second latch circuit allowing the input signal to appear at the second output end during one of first and second logic states of a second clock signal and preventing the input signal from appearing at the second output end during the other of the first and second logic states of the second clock signal, the second latch circuit latching a logic level at the second input end in response to a change of the second clock signal from the one of the first and second logic states to the other of the first and second logic states and outputting the logic level at the second output end during the other of the first and second logic states of the second clock signal.

Accordingly, an access time from the falling edge can be reduced by a setup time upon an address latch, and the access penalty of ½ tCK can be reduced.

BRIEF DESCRIPTION OF THE DRAWINGS

The above features and advantages of the present invention will be more apparent from the following description of certain preferred embodiments taken in conjunction with the accompanying drawings, in which:

FIG. 10 shows a problem of the conventional DDR circuit.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments which are illustrated for explanatory purposes.

In a DDR high-speed address-latching system, a function of sharing an address-signal pin and a command-signal pin that have been conventionally separated, and a function of fetching command data and address data both on rising and falling edges are under consideration.

In a semiconductor storage device of the present invention, address data fetched on a falling edge is latched by a through-latch-type latch circuit to support the high-speed system, thereby reducing an access time by a setup time (tS).

Figure 1:
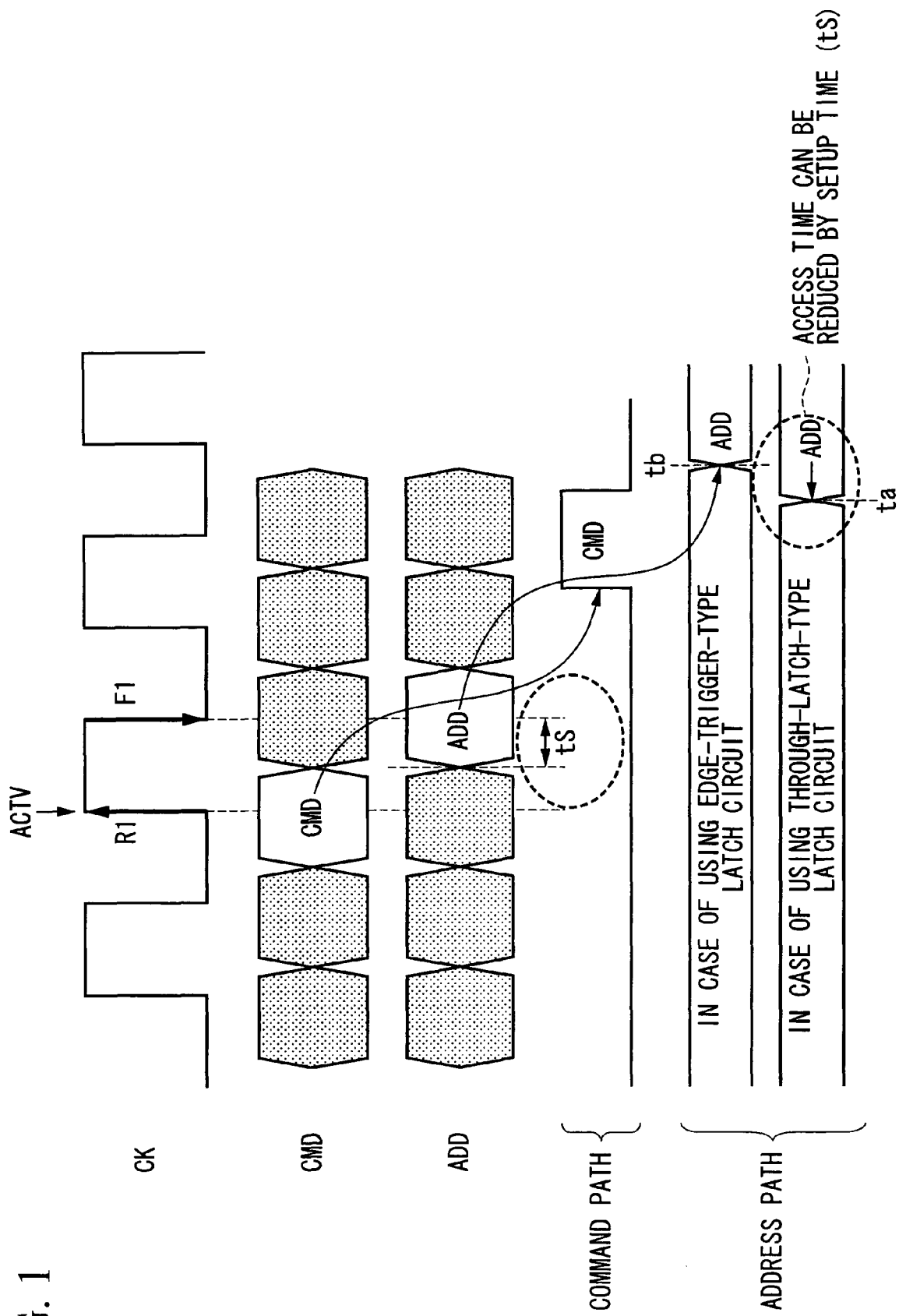
FIG. 1 shows the basic concept of a semiconductor storage device of the present invention.

FIG. 1 shows the basic concept of the semiconductor storage device of the present invention, and an example of an ACTV (active) command.

In the case of FIG. 1, input pins for address (ADD) data and command (CMD) data are shared, CMD is fetched into a command path on a rising edge R1 of a clock signal CK, and ADD is fetched into an address path on a falling edge F1 of the clock signal CK.

If a conventional edge-trigger-type latch circuit (also referred to as an "edge-trigger latch circuit") is used for fetching the ADD, the address data is fetched according to a trigger signal generated based on the falling edge F1 of the clock signal by a trigger-signal (1-shot-pulse) generation circuit explained later, and thereby ADD data appears on the address path at a time tb.

On the other hand, if a through-latch-type latch circuit (also referred to as a "through latch circuit") is used, the ADD signal appears on the address path as it is before the address is fetched according to the trigger signal, and therefore ADD data appears on the address path at a time ta. As a result, the access time is reduced by a setup time (tS) when fetching the address.

Figure 9A:
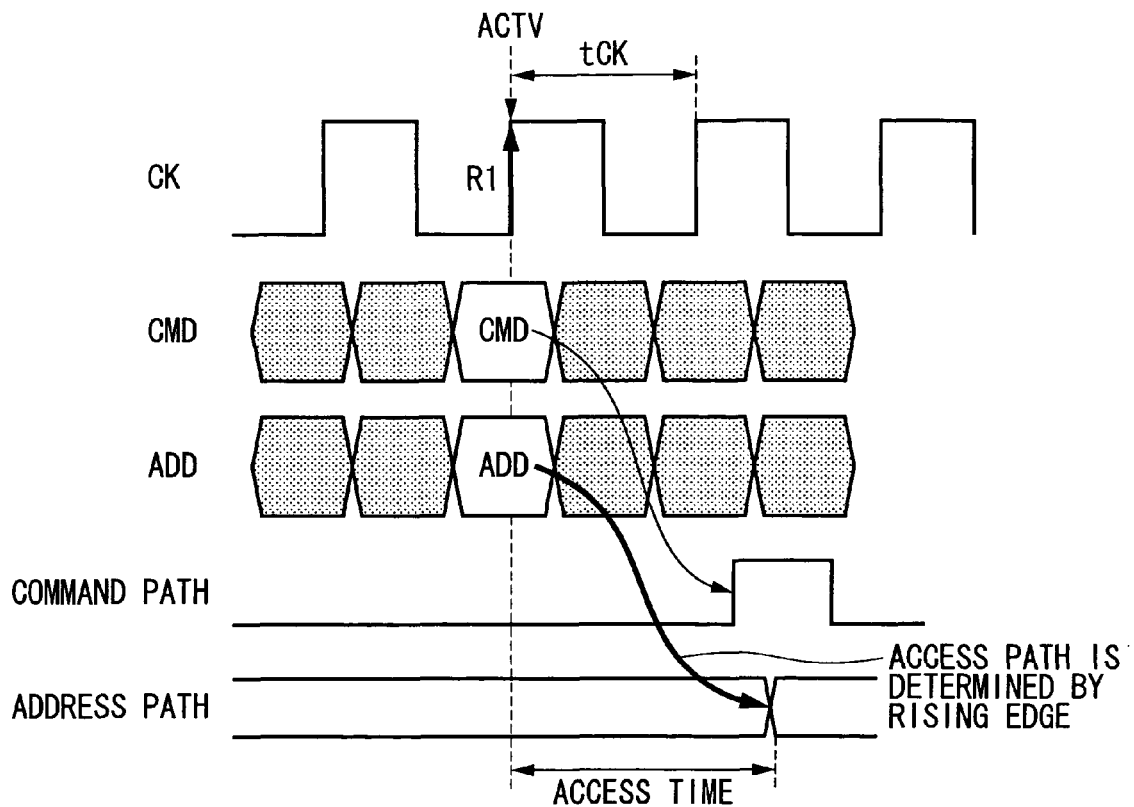
FIG. 9 shows a conventional general DDR circuit.
Figure 9B:
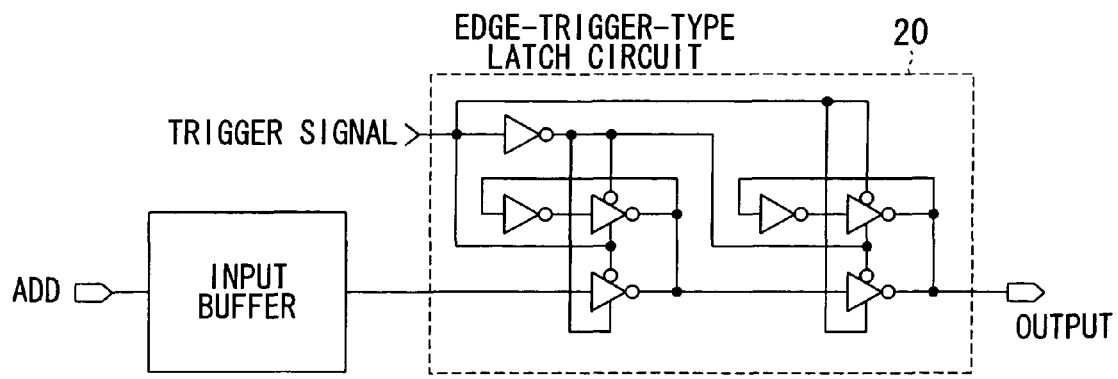

Thus, the access time determined by a falling edge can be reduced by the setup time (tS) by using the through-latch-type latch circuit when latching the address. Therefore, the conventional problem of the penalty of the period ½ tCK (see FIG. 9) can be reduced.

First Embodiment

Hereinafter, a case where both command (CMD) data and address (ADD) data are fetched by a through latch circuit is explained as a first embodiment of the present invention.

Figure 2:
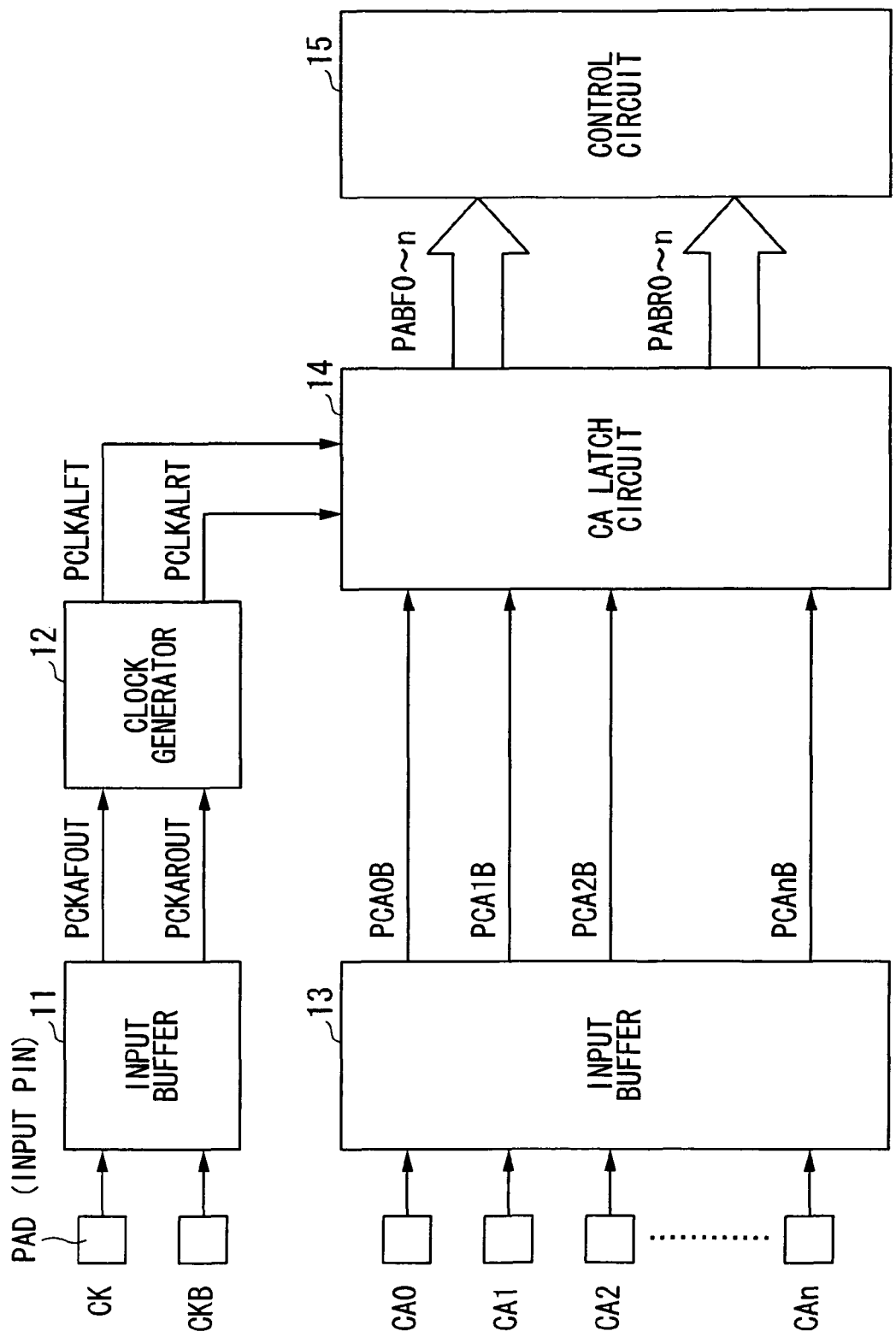
FIG. 2 shows the circuit configuration of a semiconductor storage device according to a first embodiment of the present invention.

FIG. 2 shows the circuit configuration of a semiconductor storage device according to the first embodiment of the present invention, and a part thereof related to an operation of latching CMD and ADD.

As shown in FIG. 2, a basic clock signal CK is input to a pad (input pin) for CK. The pad is to be the input pin to the circuit.

A logically-inverted signal CKB of the clock signal CK is input to an input pad for CKB, and signals CA0 to CAn on the command-and-address shared-data bus are input to shared pads for CA0 to CAn.

The shared pads for CA0 to CAn are connected to an input buffer 13 that outputs signals PCA0B to PCAnB. The input buffer 13 on the output side is connected to a CA latch circuit 14 that latches CMD data and ADD data.

The pads for CK and CKB are connected to an input buffer 11 that outputs buffer signals PCKAFOUT and PCKAROUT and is connected to a clock generator 12.

The clock generator 12 receives the signals PCKAFOUT and PCKAROUT output from the input buffer 11, and outputs signals PCLKALFT and PCLKALRT. The signal PCLKALFT is a 1-shot falling-edge pulse to be a trigger signal for a falling edge latch, and the signal PCLKALRT is a 1-shot rising-edge pulse to be a trigger signal for a rising edge latch (these signals are explained later). The 1-shot falling-edge pulse PCLKALFT and the 1-shot rising-edge pulse PCLKALRT are output to the CA latch circuit 14.

The CA latch circuit 14 receives the signals PCA0B to PCAnB output from the input buffer 13 and the signals PCLKALFT and PCLKALRT output from the clock generator 12. Based on the signals PCA0B to PCAnB, the CA latch circuit 14 latches and outputs signals PABF0 to PABFn that are address (ADD) data and signals PABR0 to PABRn that are command (CMD) data.

The control circuit 15 receives the signals (ADD data) PABF0 to PABFn and the signals (CMD data) PABR0 to PABRn that are output from the CA latch circuit 14, and controls operations in the chip.

Figure 3:
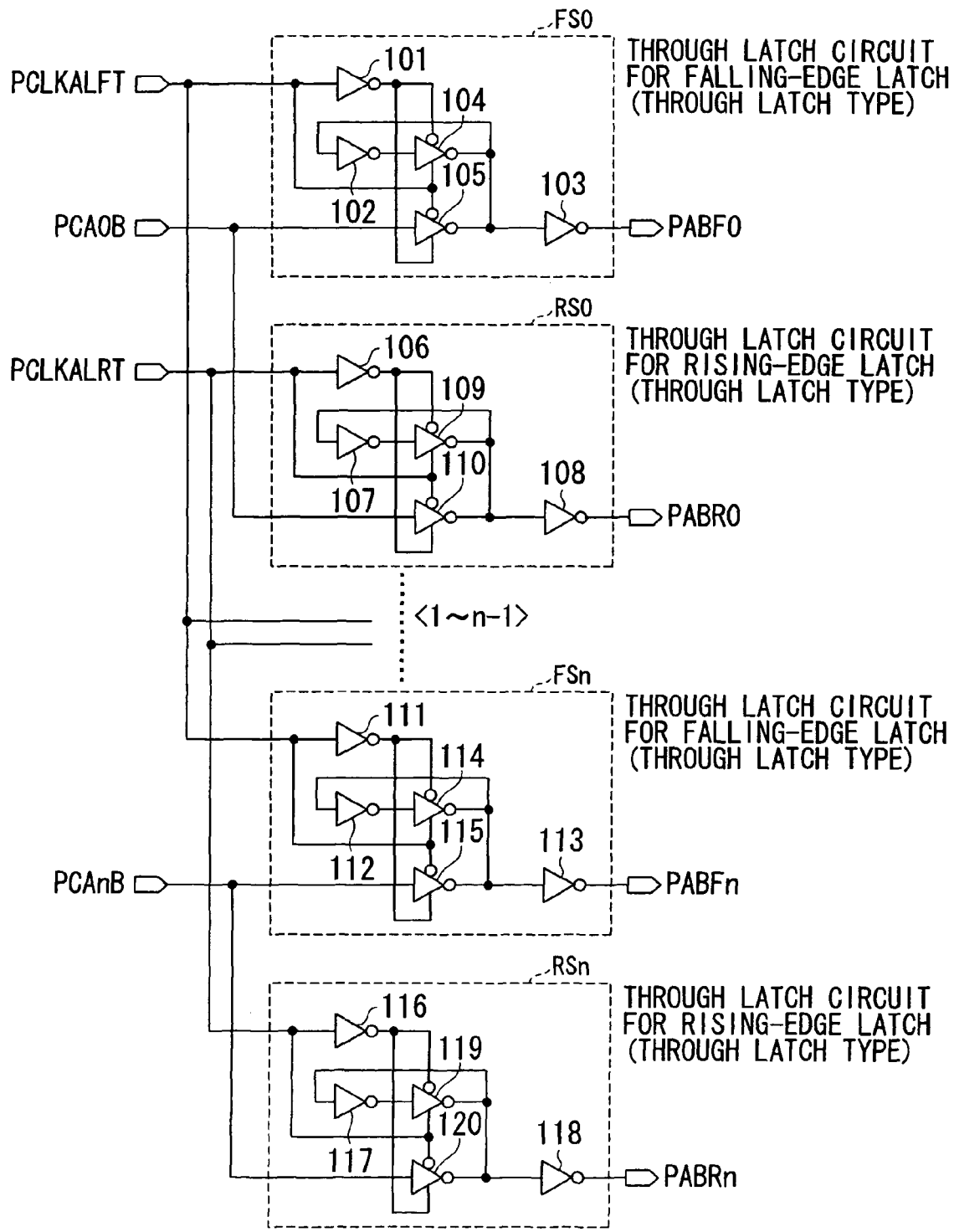
FIG. 3 shows the configuration of a CA latch circuit according to the first embodiment.

FIG. 3 shows the configuration of the CA latch circuit 14. The CA latch circuit 14 includes through latch circuits FS0 to FSn for a falling-edge latch and through latch circuits RS0 to RSn for a rising-edge latch that correspond to the signals PCA0B to PCAnB output from the input buffer 13.

The through latch circuit FS0 for the falling-edge latch receives the signal PCA0B and the 1-shot falling-edge pulse PCLKALFT and outputs the signal PABF0 to be address data (0-th bit). Similarly, the through latch circuit FSn for the falling edge latch receives the signal PCAnB and the 1-shot falling-edge pulse PCLKALFT and outputs the signal PABFn to be address data (n-th bit).

The through latch circuit RS0 for the rising-edge latch receives the signal PCA0B and the 1-shot rising-edge pulse PCLKALRT and outputs the signal PABR0 to be command data (0-th bit). Similarly, the through latch circuit RSn for the rising-edge latch receives the signal PCAnB and the 1-shot rising-edge pulse PCLKALRT and outputs the signal PABRn to be command data (n-th bit).

The through latch circuit FS0 for the falling-edge latch includes inverters 101 to 103 and clocked inverters 104 and 105. Similar to the through latch circuit for the falling-edge latch, the through latch circuit RS0 for the rising-edge latch includes inverters 106 to 108 and clocked inverters 109 and 110. The shown through latch circuits have known configurations, and therefore the explanation thereof is omitted.

Similarly, the n-th through latch circuit FSn for the falling-edge latch includes inverters 111 to 113 and clocked inverters 114 and 115. The through latch circuit RSn for the rising-edge latch includes inverters 116 to 118 and clocked inverters 119 and 120.

Hereinafter, operation of the circuit shown in FIG. 2 is explained with reference to a timing chart shown in FIG. 4. In the first embodiment, a high-speed address-latching method may include: receiving address data and command data by an input buffer; latching the command data in synchronism with a rising edge of a clock signal by a first through-latch-type latch circuit; and latching the address data in synchronism with a falling edge of the clock signal by a second through-latch-type latch circuit.

Figure 4:
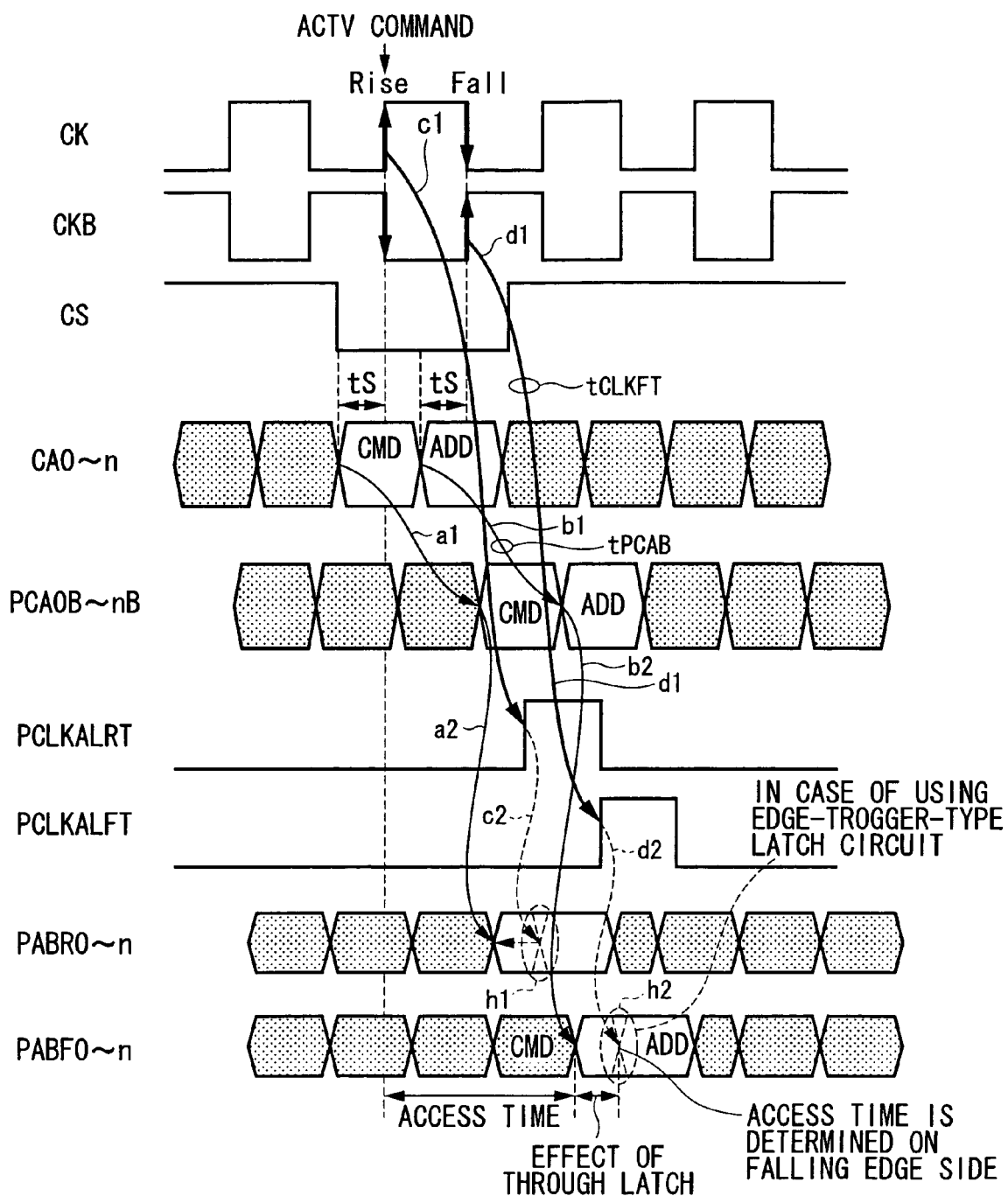
FIG. 4 shows a timing chart of circuit operations according to the first embodiment.

Each signal shown in FIG. 4 indicates an input or output signal of each circuit shown in FIG. 2. The signal CK is a clock signal received by the input buffer 11. The signal CKB is a clock signal (logically-inverted signal of the clock signal CK) received by the input buffer 11. The signals CA0 to CAn are input signals received by the input buffer 13, which are signals on the shared data bus that include both command (CMD) data and address (ADD) data. The signals PCA0B to PCAnB are buffer signals output from the input buffer 13. The signal PCLKALRT is a 1-shot rising-edge pulse signal output from the clock generator 12. The signal PCLKALFT is a 1-shot falling-edge pulse signal output from the clock generator 12. The signals PABR0 to PABRn are CMD data output from the CA latch circuit 14. The signals PABF0 to PABFn are ADD data output from the CA latch circuit 14.

In FIG. 4, the state of the chip is determined by the input state of the command pin when a chip select signal CS="L" similar to DDR_DRAM. In LPDDR2, however, the state of the chip is determined by a combination of data CA0 to CAn on a rising edge of the clock signal CK.

Commands for specifying address accesses include an ACTV (active) command, a WRIT (write) command, and a READ (read) command. If a command is specified on a rising edge of the clock signal CK, an address of the command is determined according to the state of the CA0 to CAn until a falling edge of the clock signal CK (some address is determined on the rising edge).

The ACTV command is assumed in the case of FIG. 4. Data input to the pads for CA0 to CAn are output as PCA0B to PCAnB from the input buffer 13 (see FIG. 2) to the CA latch circuit 14.

At this time, the clock signals CK and CKB are output as the rising-edge clock PCKAROUT (not shown) and the falling-edge clock PCKAFOUT (not shown) from the input buffer 11, which are then output as the 1-shot rising-edge pulse PCLKLRT and the 1-shot falling-edge pulse PCLKALFT from the clock generator 12 to the CA latch circuit 14.

Since a through-latch-type latch circuit is used as the CA latch circuit 14, the signals input to the pads for CA0 to CAn are output as the signals PCA0B to PCAnB from the input buffer 13 to the CA latch circuit 14, and then quickly output to the control circuit 15 as the signals PABR0 to PABRn.

In other words, the CMD signals of CA0 to CAn appear as the signals PABR0 to PABRn output from the CA latch circuit 14 through signal transition paths (hereinafter, "paths") indicated by arrows a1 and a2 as shown in FIG. 4.

Then, the 1-shot rising-edge pulse PCLKALRT to be a rising-edge latch clock becomes "H", and defined data is latched in the through latch circuits RS0 to RSn for the rising-edge latch (see FIG. 3).

In other words, the 1-shot rising-edge pulse PCLKALRT is generated from the clock signal CK through a path indicated by an arrow c1, and the defined data is latched in the through latch circuits RS0 to RSn for the rising-edge latch through a path indicated by an arrow c2.

Similarly, in the case of a falling edge, the signals input to the pads for CA0 to CAn are output as the signals PCA0B to PCAnB from the input buffer 13 to the CA latch circuit 14, and then quickly output to the control circuit 15 as the signals PABF0 to PABFn.

In other words, the ADD signals of CA0 to CAn appear as the signals PABF0 to PABFn output from the CA latch circuit 14 through paths indicated by b1 and b2.

Then, the 1-shot falling-edge pulse PCLKALFT generated based on the clock signal CKB becomes "H", and defined data is latched in the through latch circuits FS0 to FSn for the falling edge latch.

In other words, the 1-shot falling-edge pulse PCLKALFT is generated from the clock signal CKB through a path indicated by an arrow d1, and the defined data is latched in the through latch circuits FS0 to FSn for the falling-edge latch (see FIG. 3) through a path indicated by an arrow d2.

Thus, the CA latch circuit 14 is replaced with the through-latch-type latch circuit, and thereby defined data can be quickly output to the control circuit 15.

As explained above, data is fetched both on rising and falling edges in LPDDR2, and therefore a primal path that determines the access speed is the falling edge. If the conventional edge-trigger type latch circuit is used as the CA latch circuit 14, the output signals PABR0 to PABRn and PABF0 to PABFn are activated from the 1 shot pulses PCLKALRT and PCLKALFT as shown in the portions surrounded by dashed lines h1 and h2, and thereby the access penalty of the period ½ tCK occurs in the conventional DDR product.

If a through latch circuit is used as in the present invention, the access time is expected to be reduced by the setup time (tS) with respect to the access penalty of the period ½ tCK. If the relationship between the time tCLKFT until the signal PCLKALFT is generated from the clock signals CK and CKB and the time tPCAB until the signals PCA0B to PCAnB are generated from the input signals CA0 to CAn is "tPCAB<tCLKFT", i.e., if the path speed of the CA pin can be increased, the access time can be expected to be reduced by a value (+α) greater than the setup time (tS).

As explained above, according to the present invention, the access penalty of the period ½ tCK that occurs in the case of using the conventional edge-trigger-type latch circuit in LPDDR2 can be reduced by the setup time (tS) by replacing the edge-trigger-type latch circuit with the through-latch-type latch circuit.

Second Embodiment

Hereinafter, a semiconductor storage device according to a second embodiment of the present invention is explained.

In the high-speed address-latching method of the present invention, the access penalty is determined only by a falling edge. Therefore, data on a rising edge can be stably fetched by the edge-trigger-type latch circuit, and data on a falling edge can be fetched by the through-latch-type latch circuit in consideration of the access speed.

A case where data on a rising edge is stably fetched by the edge-trigger-type latch circuit, and data on a falling edge is fetched by the through-latch-type latch circuit in consideration of the access speed is explained as the second embodiment of the present invention.

Figure 5:
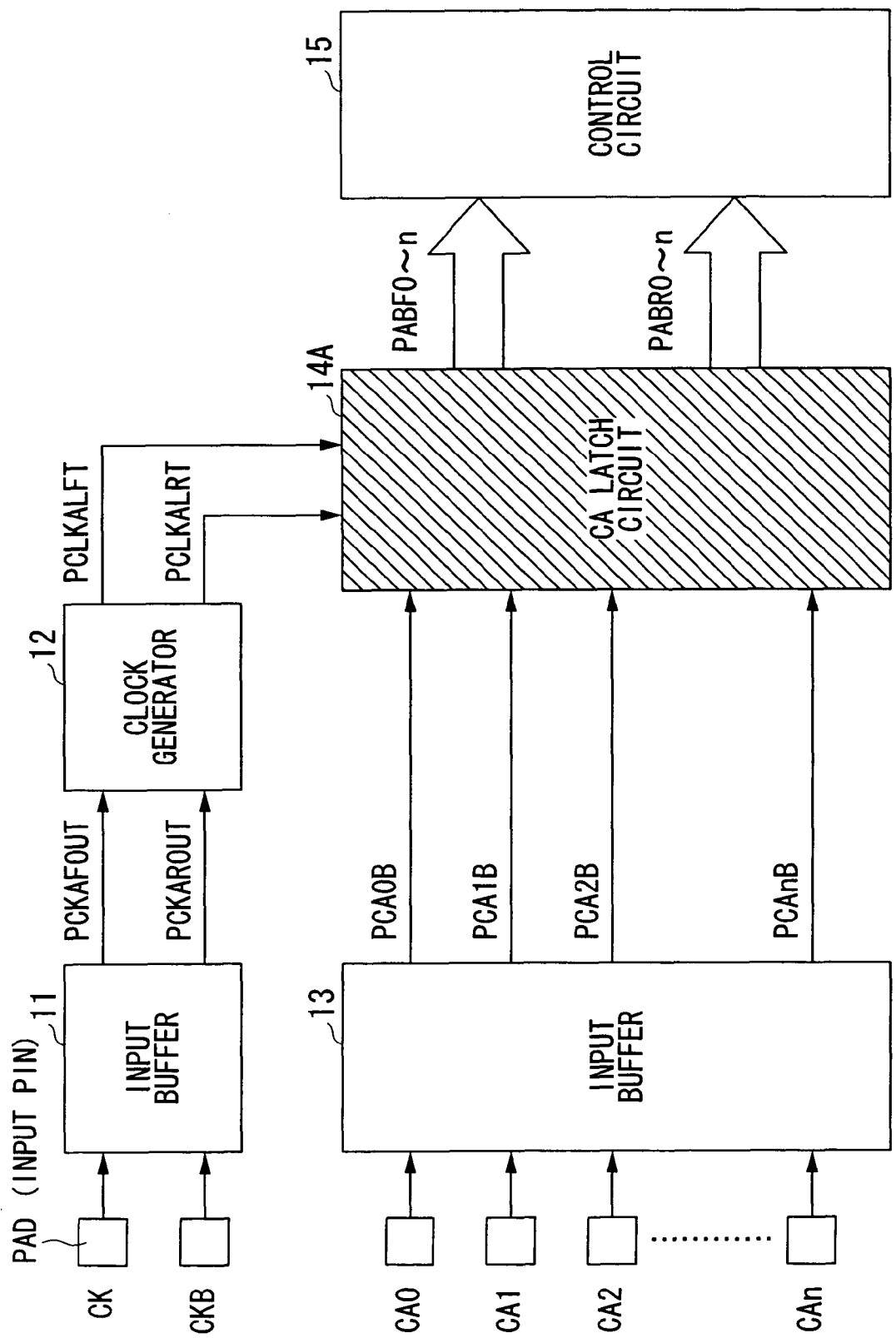
FIG. 5 shows the circuit configuration of a semiconductor storage device according to a second embodiment of the present invention.

FIG. 5 shows the circuit configuration of a semiconductor storage device according to the second embodiment, and a part thereof related to the latch operation of command (CMD) data and address (ADD) data.

The structural difference between the circuit shown in FIG. 5 and the circuit shown in FIG. 2 is that the internal configuration of the CA latch circuit 14 is changed to make a new CA latch circuit 14A. The other configuration is the same as that shown in FIG. 2. Therefore, the same elements are appended the same reference numerals, and overlapping explanation is omitted.

Figure 6:
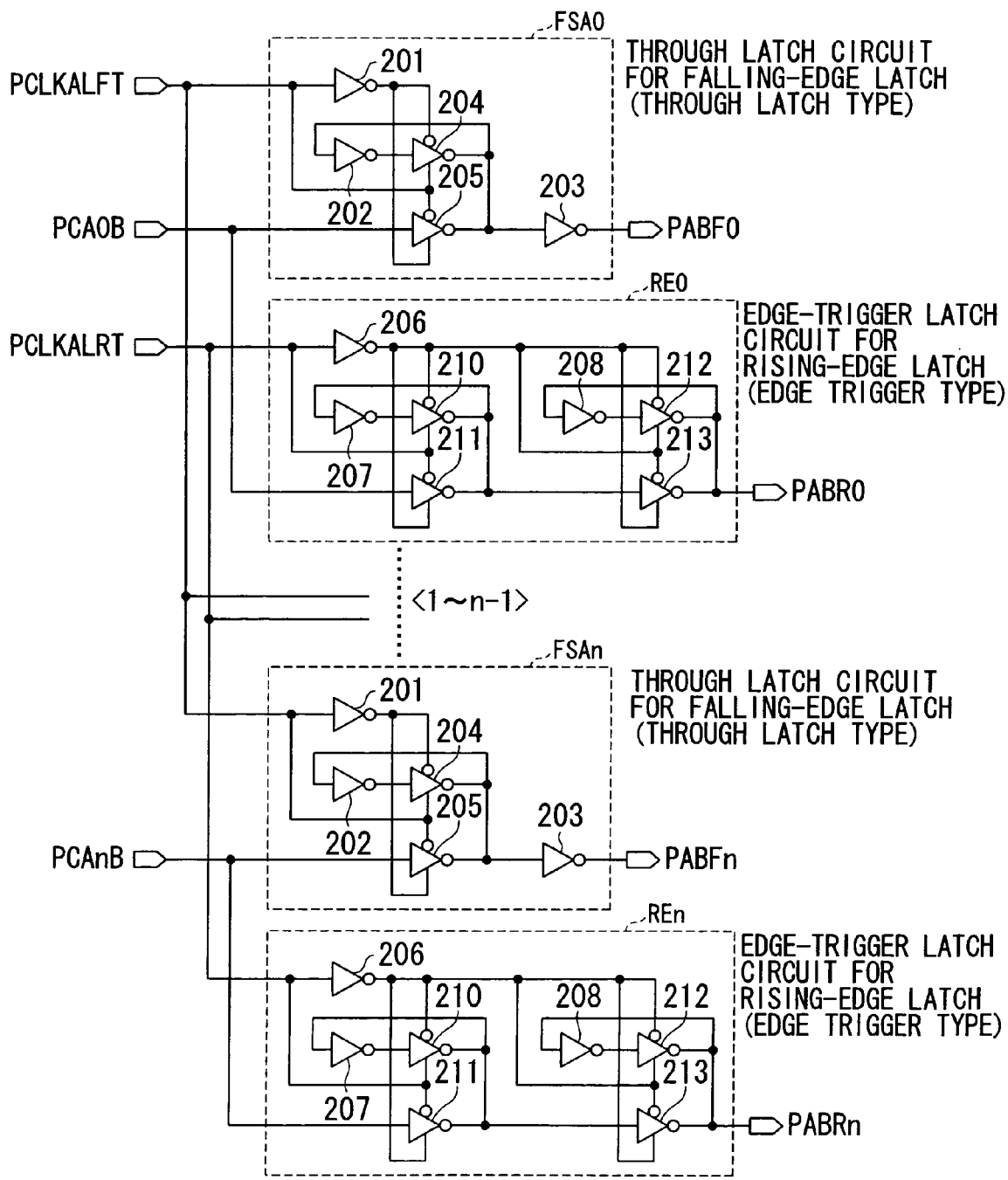
FIG. 6 shows the configuration of a CA latch circuit according to the second embodiment.

FIG. 6 shows the configuration of the CA latch circuit 14A according to the second embodiment of the present invention.

The CA latch circuit 14A shown in FIG. 6 includes through latch circuits FSA0 to FSAn for a falling-edge latch and edge-trigger latch circuits RE0 to REn for a rising-edge latch that correspond to signals PCA0B to PCAnB output from the input buffer 13.

The through latch circuit FSA0 for the falling-edge latch receives the signal PCA0B and the 1-shot falling-edge pulse PCLKALFT, and outputs a signal PABF0 to be address data (0-th bit). Similarly, the through latch circuit FSAn for the falling-edge latch receives the signal PCAnB and a 1-shot falling-edge pulse PCLKALFT, and outputs a signal PABFn to be address data (n-th bit).

The edge-trigger latch circuit RE0 for the rising-edge latch receives the signal PCA0B and a 1-shot rising-edge pulse PCLKALRT, and outputs a signal PABR0 to be command data (0-bit). Similarly, the edge-trigger latch circuit REn for the rising-edge latch receives the signal PCAnB and the 1-shot rising-edge pulse PCLKALRT, and outputs a signal PABRn to be command data (n-th bit).

Each of the through latch circuits FSA0 to FSAn for the falling-edge latch includes inverters 201 to 203 and clocked inverters 204 and 205. Each of the edge-trigger circuits RE0 to REn for the rising-edge latch includes inverters 206 to 209 and clocked inverters 210 to 213. The through latch circuit and the edge-trigger latch circuit have known configurations, and therefore explanation thereof is omitted.

Figure 7:
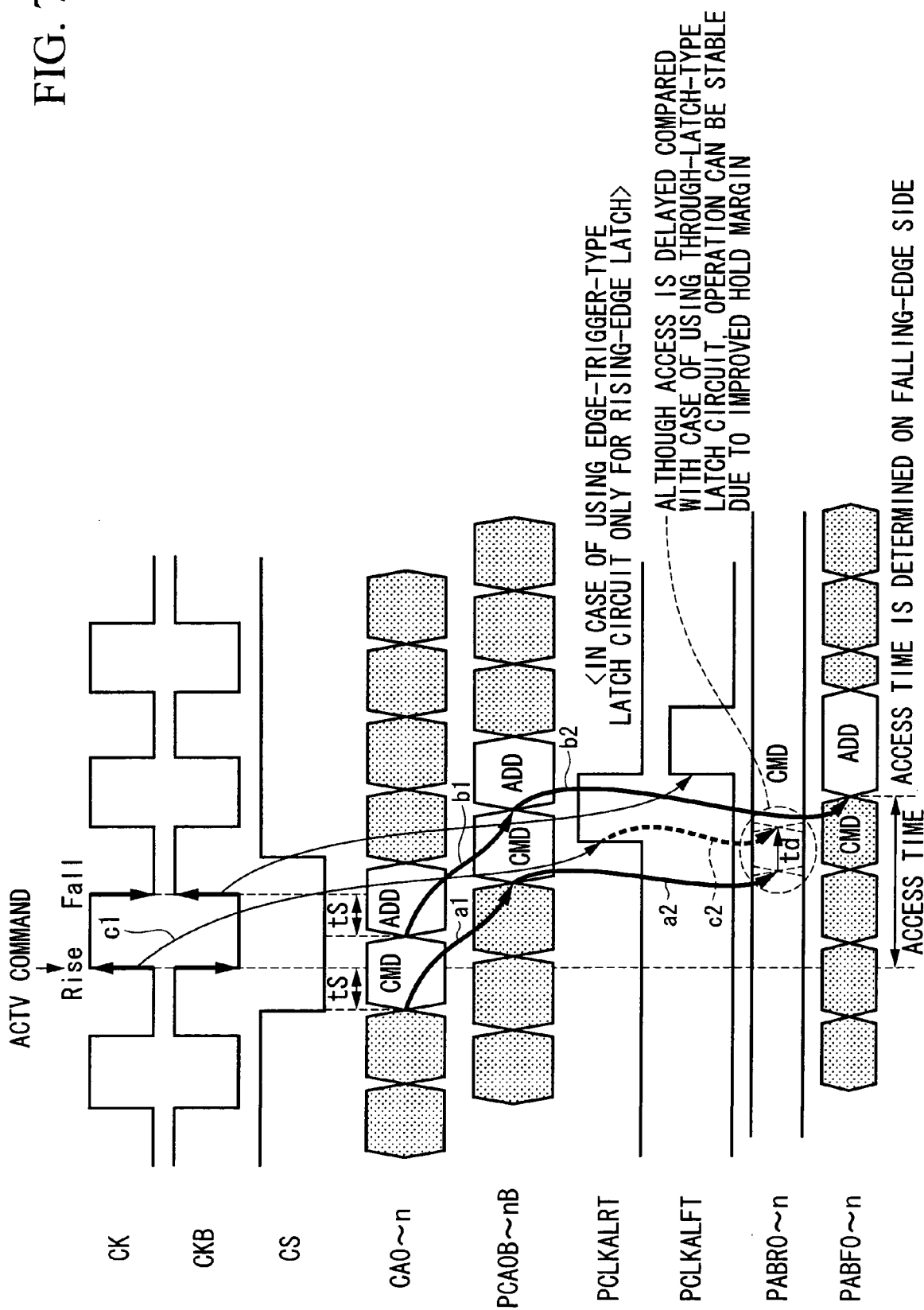
FIG. 7 shows a timing chart of circuit operations according to the second embodiment.

FIG. 7 shows a timing chart of operations according to the second embodiment. In the second embodiment, a high-speed address-latching method may include: receiving address data and command data by an input buffer; latching the command data in synchronism with a rising edge of a clock signal by an edge-trigger-type latch circuit; and latching the address data in synchronism with a falling edge of the clock signal by a through-latch-type latch circuit.

Each signal such as the signal CK shown in FIG. 7 is the same as that shown in FIG. 4, and therefore, overlapping explanation thereof is omitted.

In the second embodiment of the present invention as shown in FIG. 7, with respect to the command signals PABR0 to PABRn, the 1-shot rising-edge pulse PCLKALRT is generated from the rising edge of the clock signal CK through a path indicated by an arrow c1, and CMD data in the signals PABR0 to PABRn are latched in the edge-trigger latch circuits RE0 to REn for the rising-edge latch (see FIG. 6).

Thus, when the edge-trigger-type latch circuits RE0 to REn are used only for the rising-edge latch, the access time is delayed by the time td compared with the case where the through-latch-type latch circuits are used (paths a1 and a2). However, the hold margin is improved, thereby enabling stable operation. In other words, the edge-trigger-type latch circuit has good hold property and secures data until the next clock is input, and thereby stably operates.

Since the through-latch-type latch circuits FSA0 to FSAn (see FIG. 6) are used on the falling-edge side, ADD data in the signals CA0 to CAn appears as the output signals PABF0 to PABFn through paths indicated by the arrows b1 and b2. In other words, the through-latch type latch circuits are used as the address latch circuit, and thereby the access time starting from the falling edge can be reduced by the setup time (tS) when latching the address. Therefore, the access penalty of the period ½ tCK (see FIG. 9) that has been the problem of the conventional technique can be reduced.

In this manner, according to the second embodiment of the present invention, only data on the rising edge is stably fetched by the edge-trigger-type latch circuit, and data on the falling edge is fetched by the through-latch-type latch circuit in consideration of the access speed since the access penalty is determined only by the falling edge. As a result, the faster access and the improvement of the circuit operation margin can be enabled.

Although the embodiments of the present invention are explained above, the present invention is applicable to a semiconductor storage device (LSI) having the function of fetching data both on rising and falling edges. Particularly, the present invention is effectively applicable to DRAM.

Figure 8:
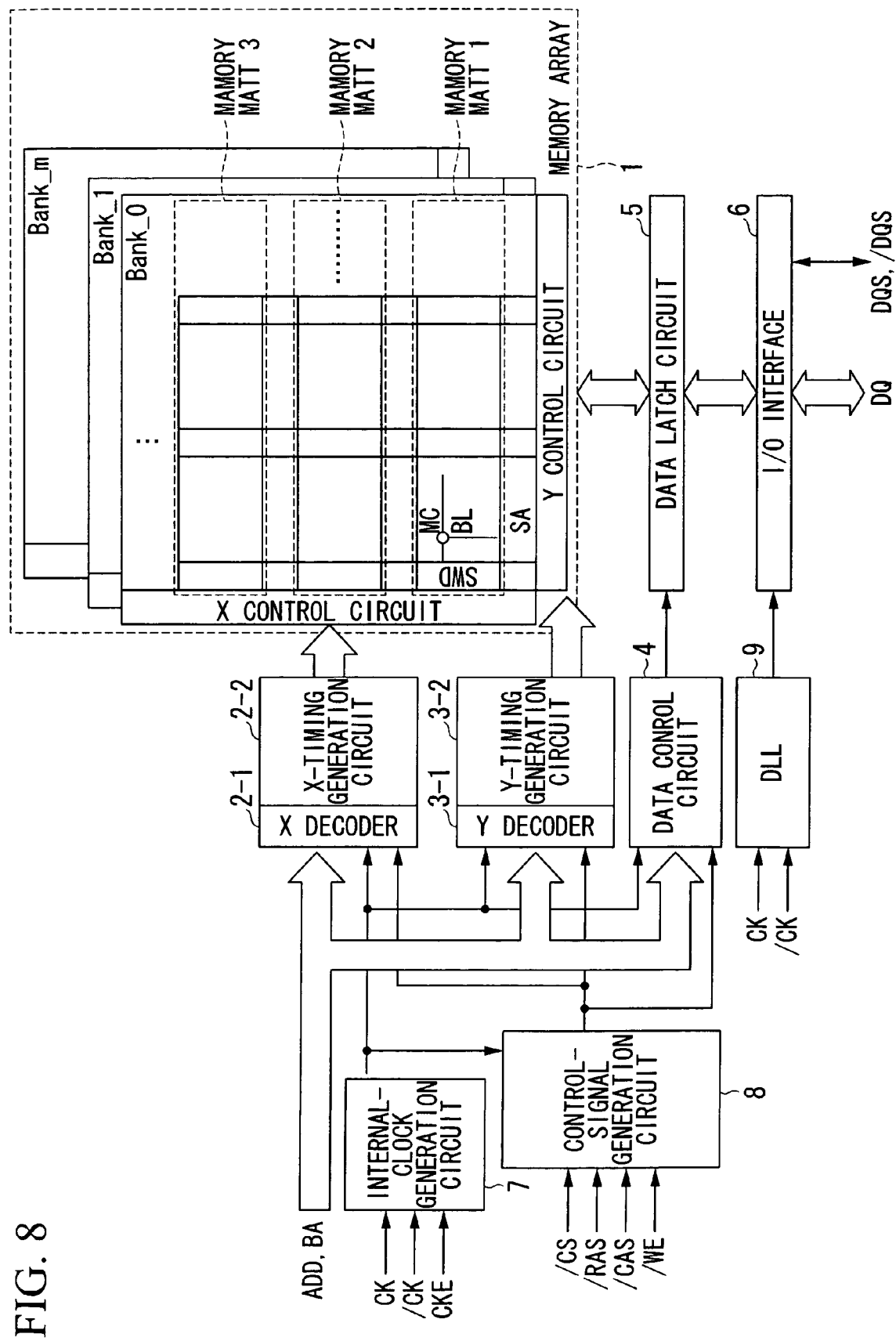
FIG. 8 shows an example of DRAM to which the present invention is applicable.

FIG. 8 shows the outline configuration of DRAM to which the present invention is applicable. The configuration of DRAM shown in FIG. 8 is known, but briefly explained hereinafter.

The DRAM shown in FIG. 8 includes a memory array 1, an X-decoder 2-1, an X-timing generation circuit 2-2, a Y-decoder 3-1, a Y-timing generation circuit 3-2, a data control circuit 4, a data latch circuit 5, an I/O interface 6, an internal-CLK (clock) generation circuit 7, a control-signal generation circuit 8, and a DLL (Delay Locked Loop) circuit 9.

The memory array 1 includes multiple banks (Bank_0, ..., Bank_m), each of which includes multiple memory mat sequences (memory mat sequence 0, memory mat sequence 1, memory mat sequence 2, ...). Each memory mat sequence includes multiple memory mats each including a word line (WL), a bit line (BL), a sense amplifier (SA), and a sub-word driver (SWD) circuit. A memory cell (MC) is present at the intersection of each word line and each bit line.

The memory array 1, the data latch circuit 5, and the I/O interface 6 are connected to one another through data transfer buses. The data control circuit 4 controls transfer of data by the data latch circuit 5. The DLL circuit 9 receives signals CK (Clock) and /CK, and controls an output timing of data by the I/O interface 6. The X-decoder 2-1, the X-timing generation circuit 2-2, the Y-decoder 3-1, and the Y-timing generation circuit 3-2 control writing and reading to and from the memory cell of the memory array 1. The internal-CLK generation circuit 7 receives the signals CK, /CK, and CKE (Clock Enable) and generates clocks to be used by the X-decoder 2-1, the Y-decoder 3-1, and the data control circuit 4. The control-signal generation circuit 8 generates and outputs control signals for controlling the X-decoder 2-1, the X-timing generation circuit 2-2, the Y-decoder 3-1, and the Y-timing generation circuit 3-2 based on the received signals /CS (Chip Select), /RAS (Row Address Strobe), /CAS (Column Address Strobe), and /WE (Write Enable). The symbol / indicates that the low level becomes the active level.

The DRAM having the above configuration can support the high-speed system in which data are fetched both on rising and falling edges of the clock signal by the use of the CA latch circuit of the present invention that includes the through latch circuit when ADD data and CMD data are fetched.

It is apparent that the present invention is not limited to the above embodiments, but may be modified and changed without departing from the scope and spirit of the invention.

What is claimed is:

1. A semiconductor storage device, comprising:
   an input buffer that receives address data and command data;
   a first through-latch-type latch circuit that latches the command data in synchronism with a rising edge of a clock signal; and
   a second through-latch-type latch circuit that latches the address data in synchronism with a falling edge of the clock signal.

2. The semiconductor storage device according to claim 1, wherein the semiconductor storage device comprises a DRAM (Dynamic Random Access Memory) compatible with a Low Power DDR2 (Double Data Rate) system.

3. The semiconductor storage device of claim 1, the command data thereby appearing on a command path at an access time ta shorter than a setup time tS of the first through-latch-type latch circuit, and the address data thereby appearing on an address path at an access time ta shorter than a setup time tS of the second through-latch-type latch circuit.

4. A semiconductor storage device, comprising:
- an input buffer that receives address data and command data;
- an edge-trigger-type latch circuit that latches the command data in synchronism with a rising edge of a clock signal; and
- a through-latch-type latch circuit that latches the address data in synchronism with a falling edge of the clock signal.

5. The semiconductor storage device according to claim 4, wherein the semiconductor storage device comprises a DRAM (Dynamic Random Access Memory) compatible with a Low Power DDR2 (Double Data Rate) system.

6. The semiconductor storage device of claim 4, the address data thereby appearing on an address path at an access time ta shorter than a setup time tS of the through-latch-type latch circuit.

7. A semiconductor device, comprising:
- an input node supplied with an input signal;
- a first latch circuit having a first input end coupled to the input node to receive the input signal and a first output end, the first latch circuit operating in response to a first clock signal; and
- a second latch circuit having a second input end coupled to the input node to receive the input signal and a second output end, the second latch circuit allowing the input signal to appear at the second output end during one of first and second logic states of a second clock signal and preventing the input signal from appearing at the second output end during the other of the first and second logic states of the second clock signal, the second latch circuit latching a logic level at the second input end in response to a change of the second clock signal from the one of the first and second logic states to the other of the first and second logic states and outputting the logic level at the second output end during the other of the first and second logic states of the second clock signal.

8. The semiconductor device according to claim 7, wherein the first latch circuit allows the input signal to appear at the first output end during one of first and second logic states of the first clock signal and prevents the input signal from appearing at the first output end during the other of the first and second logic states of the first clock signal, the first latch circuit latching a logic level at the first input end in response to a change of the first clock signal from the one of the first and second logic states to the other of the first and second logic states and outputting the logic level at the first output end during the other of the first and second logic states of the first clock signal.

9. The semiconductor device according to claim 7, wherein the first latch circuit latches a logic level at the first input end in response to a change from one of first and second states of the first clock signal to the other of the first and second states thereof and continues to output the logic level at the first output end during a period of time corresponding to the first and second logic states of the first clock signal and including a change from the other of the first and second logic states of the first clock signal to the one of the first and second states thereof.

10. The semiconductor device according to claim 7, wherein the input signal includes first input data and second input data following the first input data, the first latch circuit being operative to latch and output the first data at the first output end, and the second latch circuit being operative to latch and output the second data at the second output end.

11. The semiconductor device according to claim 10, wherein the first data comprises command data, and the second data comprises address data.

12. The semiconductor device according to claim 10, wherein the first data comprises command data, and the second data comprises command data.

13. The semiconductor device according to claim 10, wherein the first data comprises address data, and the second data comprises address data.

14. The semiconductor device according to claim 7, wherein the first latch circuit is of an edge trigger type, and the second latch circuit is of a through latch type.

15. The semiconductor device according to claim 7, wherein each of the first and second latch circuits is of a through latch type.

16. A semiconductor device, comprising:
- an input node supplied with first and second data in sequence, the first data being valid between a first starting point and a first ending point, the second data being valid between a second starting point substantially coincident with the first ending point and a second ending point, the first starting and ending points sandwiching a first rising edge of a clock signal therebetween, and the second starting and ending points sandwiching a first trailing edge next to the first rising edge of the clock signal therebetween;
- a first latch circuit including a first node and a second node coupled to the input node, outputting the first data to the first data to the first node without latching during a first period defined by the first starting point and the first rising edge, and latching the first data at the first node during a second period defined by the first rising and trailing edges; and
- a second latch circuit including a third node and a fourth node coupled to the input node, latching the second data at the third node during a third period defined by the first trailing edge and a second rising edge appearing next to the first trailing edge.

17. The semiconductor device according to claim 16, wherein the second latch circuit outputs the second data to the third node without latching during a fourth period defined by the second starting point and the first trailing edge.

18. The semiconductor device according to claim 16, further comprising:
- a memory array including a plurality of memory cells each selected by an associated one or ones of address signals; and
- a control circuit controlling an access to selected one or ones of the memory cells in response to command signals,
- wherein the first data serves as a portion of one of the command signals and the second data serves as a portion of one of the address signals.

19. The semiconductor device according to claim 16, wherein the second period is substantially equal to the third period.

* * * * *